(12) United States Patent
Hirota et al.

(10) Patent No.: US 6,316,329 B1
(45) Date of Patent: Nov. 13, 2001

(54) FORMING A TRENCH MASK COMPRISING A DLC AND ASH PROTECTING LAYER

(75) Inventors: Toshiyuki Hirota; Shinji Nakagawa, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/473,121

(22) Filed: Dec. 28, 1999

(30) Foreign Application Priority Data

Dec. 30, 1998 (JP) .................................................. 10-377124

(51) Int. Cl.⁷ .......................... H01L 21/76; H01L 21/302; H01L 21/461
(52) U.S. Cl. .......................... 438/424; 438/692; 438/693; 438/952
(58) Field of Search ................................... 438/424, 692, 438/693, 700, 702, 952

(56) References Cited

U.S. PATENT DOCUMENTS 5,246,884 * 9/1993 Jaso et al. .
5,532,191 * 7/1996 Nakamo et al. .

FOREIGN PATENT DOCUMENTS 60-83331   5/1985 (JP) .
61-166041  7/1986 (JP) .
406349782-A * 12/1994 (JP) .
7-86393    3/1995 (JP) .

* cited by examiner

Primary Examiner—John F. Niebling
Assistant Examiner—Ron Pompey
(74) Attorney, Agent, or Firm—Sughrue, Mion, Zinn, Macpeak & Seas, PLLC

(57) ABSTRACT

In a process for fabricating a semiconductor device, an DLC (diamond like carbon) film is formed on a principal surface of a semiconductor substrate, and an ashing protecting film is formed on the DLC film for protecting the DLC film from an ashing. A hard mask film having a resisting property against an etching agent for the ashing protecting film and the DLC film, is formed on the ashing protecting film. The hard mask film is patterned using a patterned photo resist film as a mask, and then, the patterned photo resist film is removed by an oxygen ashing. The ashing protecting film and the DLC film is patterned using the patterned hard mask film as a mask, and a trench is formed in the principal surface of the semiconductor substrate using the patterned hard mask film, ashing protecting film and DLC film as a mask. An insulator film is deposited on the whole surface to completely fill up the trench. The deposited insulator film, the hard mask film and the ashing protecting film are etched back by a chemical mechanical polishing, using the DLC film as an etching stopper. The DLC film is removed by the ashing, so that the deposited insulator film remains in only the trench to constitute a trench isolation structure.

7 Claims, 14 Drawing Sheets

PERIPHERAL REGION    CENTRAL REGION

136 SiN
135 AMORPHOUS SILICON
134 DLC FILM
133 SiO
132 BSG
131 SiO 138
137 PHOTO RESIST
136
135
134
133
132
131

FORMING A TRENCH MASK COMPRISING A DLC AND ASH PROTECTING LAYER

BACKGROUND OF THE INVENTION

The present invention relates to a process for fabricating a semiconductor device having a planarized surface, and more specifically to a process for fabricating a semiconductor device of a trench isolation type semiconductor device in which a device isolation is realized by filling an insulator film into a trench formed in a semiconductor substrate or a semiconductor device having a buried interconnection structure of a conductive material filled up into a trench formed in an interlayer insulator film.

With an increased integration density of the semiconductor device, a device isolation structure has changed from a conventional LOCOS (local oxidation of silicon) type to a trench isolation realized by filling an insulator film into a trench. In particular, recently, in order to further microminiaturize the semiconductor device, the trench isolation structure trends to reduce not only a trench width not also a trench depth. For example, a shallow trench isolation (abbreviated to "STI") having the trench width of 0.2 μm and the trench depth of 0.3 μm has been already reduced into practice.

Furthermore, a semiconductor device having a multi-level interconnection structure has been proposed which has an interconnection formed of a buried interconnection structure of a conductive material filled up into a trench formed in an interlayer insulator film on a semiconductor substrate, in order to planarize a surface (buried interconnection structure).

In the trench isolation structure and the buried interconnection structure, the trench is formed in the semiconductor substrate and in the interlayer insulator film, and the insulator film or the conductive material is filled up into the trench. Thereafter, the insulator film or the conductive material is removed from regions other than the trench by a chemical mechanical polishing (CMP).

Here, this type of technology will be described with reference to an example of the trench isolation structure. First, as shown in FIG. 1A, a silicon oxide film 202 having a thickness of 20 nm is formed on a principal surface of a silicon substrate 201 by means of a thermal oxidation, and a silicon nitride film 203 having a thickness of 150 nm is formed on the silicon oxide film 202 by means of a CVD (chemical vapor deposition) process. Furthermore, a silicon oxide film 204 having a thickness of 10 nm is formed on the silicon nitride film 203 by means of the CVD process.

Thereafter, as shown in FIG. 1B, a photo resist film 205 is formed on the silicon oxide film 204, and then, is selectively removed from a portion of the photo resist film corresponding to a device isolation region to form a patterned photo resist film having an aperture 206. By using the patterned photo resist 205 as a mask, the silicon oxide film 204 and the silicon nitride film 203 are etched to form an opening 207, as shown in FIG. 1C. Furthermore, the photo resist film 205 is removed by means of an ashing. In this ashing process, the silicon oxide film 204 is simultaneously removed.

Then, as shown in FIG. 1D, by using the patterned silicon nitride film 203, the silicon substrate 201 is etched to a desired depth so that a fine and shallow trench (device isolation trench) 208 is formed.

Thereafter, as shown in FIG. 1E, a silicon oxide film 209 formed of a non-doped silicate glass (NSG) which is obtained by decomposing TEOS (tetraethoxysilane) by a LPCVD (low pressure CVD) process, is deposited on the silicon substrate 201 to fill up the trench 208. The non-doped silicate glass (NSG) obtained by decomposing the TEOS will be called a "TEOS NSG" in this specification. Since this TEOS NSG film 209 has a feature that a precursor of the film has a large surface migration, and therefore since the TEOS NSG film has a relatively good step coverage, the TEOS NSG film is very effective in filling up the trench.

Thereafter, as shown in FIG. 1F, the TEOS NSG film 209 and the silicon nitride film 203 are etch-removed by a chemical mechanical polishing (CMP) until a lower portion of the silicon nitride film 203 remains. Furthermore, a surface of the TEOS NSG film 209 is etched to a certain degree so that the level of the surface of the TEOS NSG film 209 is lower than the level of the silicon nitride film 203, as shown in FIG. 1G.

As shown in FIG. 1H, the silicon nitride film 203 is etch-removed by a hydrofluoric acid, and succeedingly, the silicon oxide film 202 is etch-removed by a wet etching. In this process, the surface of the TEOS NSG film 209 is etched to a certain degree, so that the level of the surface of the TEOS NSG film 209 becomes the same as the level of the silicon nitride film 203. Thus, the TEOS NSG film 209 remains in the condition that the TEOS NSG film 209 fills up in only the trench 208. Namely, the STI structure is formed.

In the above mentioned STI structure, however, when the TEOS NSG film 209 is etch-removed by the CMP process, an abrasive agent is applied to a surface of a wafer including a number of silicon substrates 201, and the surface of the wafer is polished. In this polishing process, because of a camber of the wafer and an uneven distribution of a contacting force of the abrasive agent, the polishing amount varies on the surface of the wafer. Generally, as shown in FIG. 2A, the polishing amount in a central region of a silicon wafer W is remarkably larger than the polishing amount in a peripheral region of the silicon wafer W, with the result that a central region of a surface of the silicon wafer W is recessed in comparison with a peripheral region of the surface of the silicon wafer W. Therefore, as shown in FIGS. 2B and 2C which are enlarged diagrammatic sectional views of the peripheral region and the central region of the silicon wafer, for illustrating the condition that the silicon nitride film 203 has been polished by the CMP process, a thickness $t_1$ of the silicon nitride film 203 remaining in the central region of the silicon wafer W becomes smaller than a thickness $t_2$ of the silicon nitride film 203 remaining in the peripheral region of the silicon wafer W.

In the condition that the silicon nitride film 203 has a thickness variation caused in the CMP process, if the process is advanced, in the process shown in FIG. 1H, the remaining step X1 occurs as shown in FIG. 2D, because the height of the TEOS NSG film 209 from the principal surface of the silicon substrate 210 in the wafer peripheral region is higher than the height of the TEOS NSG film 209 from the principal surface of the silicon substrate 210 in the wafer central region. On the other hand, in the wafer central region, the etching of the TEOS NSG film 209 exceeds an expected amount, so that as shown in FIG. 2E, a divot X2 occurs at a boundary between the TEOS NSG film 209 filled in the trench 208 and the silicon substrate 210 at the principal surface of the silicon substrate 210. The reason for this is that: because an edge of the TEOS NSG film 209 contacts with an edge of the trench 208 of the silicon substrate 210 which is not etched in the process shown in FIG. 1H, the etching advances from the edge of the edge of the TEOS NSG film 209 into an inside of the trench 208.

If the remaining step X1 or the divot X2 occurs in the silicon substrate, the planarity of the surface of the silicon substrate is deteriorated, with the result that a variation occurs in the size of a gate electrode formed on a silicon substrate in a later step, and therefore, it becomes difficult to fabricate a MOS transistor as designed. Alternatively, an etching residual of a gate electrode material often causes a short-circuit, with the result that the device becomes defective. This problem similarly occurs in forming the buried interconnection structure, because the deterioration of the planarity causes the size variation of an upper level interconnection and a short-circuiting.

Incidentally, in connection with the above mentioned problem, Japanese Patent Application Pre-examination Publication No. JP-A-61-166041 proposes a technology for forming a planar device isolation structure, by using a diamond thin film as a polishing stop thin film, since the diamond thin film has a high mechanical resistance. However, this publication only discloses that a reaction ion etching is used for patterning the diamond thin film into a desired pattern, but the details are not disclosed in connection with a method for forming a mask used for etching the diamond thin film, and a method for removing the mask.

Because of this, according to the disclosure of this publication, the diamond thin film which has the high mechanical resistance but which can be easily removed by an oxygen ashing, is patterned into a desired pattern by use of a pattern photoresist, however, when the photo resist is ashed, the diamond thin film is simultaneously removed by the ashing process. In other words, the disclosure of this publication is difficult to actually use the diamond thin film as the etching stopper in the CMP process.

BRIEF SUMMARY OF THE INVENTION

Accordingly, it is an object of the present invention to provide a process for fabricating a semiconductor device having a trench isolation structure or a buried interconnection stricture, capable of planarizing the surface thereby to prevent the deterioration of the device characteristics and the device defective.

The above and other objects of the present invention are achieved in accordance with the present invention by a process for fabricating a semiconductor device, comprising the steps:

forming an DLC film (formed of a diamond film or a diamond like carbon film) on a surface of a basic layer;

forming on the DLC film an ashing protecting film for protecting the DLC film from an ashing;

forming on the ashing protecting film a hard mask film having a resisting property against an etching agent for the ashing protecting film and the DLC film;

patterning the hard mask film using a patterned photo resist film as a mask;

removing the patterned photo resist film by the ashing;

patterning the ashing protecting film and the DLC film using the patterned hard mask film as a mask, and forming a trench in the surface of the basic layer;

depositing a film on the whole surface to fill up the trench;

removing the deposited film, the hard mask film and the ashing protecting film by a chemical mechanical polishing, using the DLC film as an etching stopper; and removing the DLC film by the ashing, so that the deposited film remains in only the trench.

Accordingly, the present invention can be applied to form a trench isolation structure in which an insulator film is filled in a trench formed in a semiconductor substrate. In this case, the process in accordance with the present invention comprises the steps:

forming on a surface of a silicon substrate a first silicon oxide film, an DLC film, an amorphous silicon film constituting an ashing protecting film, and a second silicon oxide film acting as a hard mask film, in the named order;

patterning the second silicon oxide film using a patterned photo resist film as a mask;

removing the patterned photo resist film by an ashing;

selectively etching the amorphous silicon film, the DLC film and the first silicon oxide film using the patterned second silicon oxide film as a mask;

forming a trench in the surface of the silicon substrate using the amorphous silicon film, the DLC film and the first silicon oxide film as a mask;

depositing on the whole surface including the trench an insulator film having a thickness sufficient to completely fill up the trench with the deposited insulator film;

removing the deposited insulator film, the second silicon oxide film and the amorphous silicon film by a chemical mechanical polishing, using the DLC film as an etching stopper;

removing the DLC film by the ashing; and removing the first silicon oxide film, so that the deposited insulator film remains in only the trench.

Alternatively, the present invention can be applied to form a buried interconnection structure in which a conductive film is filled in a trench formed in an interlayer insulator film formed on a semiconductor substrate. In this case, the process in accordance with the present invention comprises the steps:

forming an DLC film, an ashing protecting film, and a hard mask film in the named order, on a surface of a lower level interlayer insulator film formed on a silicon substrate in which a circuit device is formed;

patterning the hard mask film using a patterned photo resist film as a mask;

removing the patterned photo resist film by an ashing;

selectively etching the ashing protecting film and the DLC film using the patterned hard mask film as a mask;

forming a trench in the surface of the lower level interlayer insulator film using the hard mask film, the ashing protecting film and the DLC film as a mask depositing on the whole surface including the trench a conductive film having a thickness sufficient to completely fill up the trench with the deposited conductive film;

removing the deposited conductive film, the hard mask film and the ashing protecting film by a chemical mechanical polishing, using the DLC film as an etching stopper;

removing the DLC film by the ashing; and forming an upper level interlayer insulator film to cover at least the deposited conductive film remaining in the trench.

With the above mentioned arrangement, when the insulator film or the conductive film filled up in a trench formed in the substrate or the interlayer insulator film is etched back by the chemical mechanical polishing (CMP) process, since the DLC film is formed as the etching stopper in the CMP process, the insulator film or the conductive film can be polished to have a uniform thickness over the whole region of the wafer so that the thickness of the insulator film or the conductive film in the peripheral region of the wafer is substantially equal to the thickness of the insulator film or the conductive film in the central region of the wafer. Therefore, it is possible to prevent the generation of the step in the trench isolation structure and the buried interconnection structure, and also to prevent generation of the divot.

In addition, in the process for previously patterning the DLC film to form the trench, since the ashing protecting film is previously formed to cover and protect the DLC film, and since the hard mask of the silicon nitride or oxide film is formed on the ashing protecting film, after the DLC film is patterned by using the photo resist film, even if the photo resist film is removed by the ashing, the DLC film is not removed by the ashing process. Therefore, it is possible to pattern the DLC film with a high degree of precision, and accordingly, it is possible to realize the trench isolation structure and the buried interconnection structure with a high degree of precision.

The above and other objects, features and advantages of the present invention will be apparent from the following description of preferred embodiments of the invention with reference to the accompanying drawings.

DETAILED DESCRIPTION OF THE INVENTION

Now, embodiments of the process of the present invention will be described with reference to the drawings.

Referring to FIGS. 3A to 3J, there are shown diagrammatic sectional views of a semiconductor device, for illustrating a first embodiment of the process in accordance with the present invention for forming the shallow trench isolation structure.

Figure 3A:
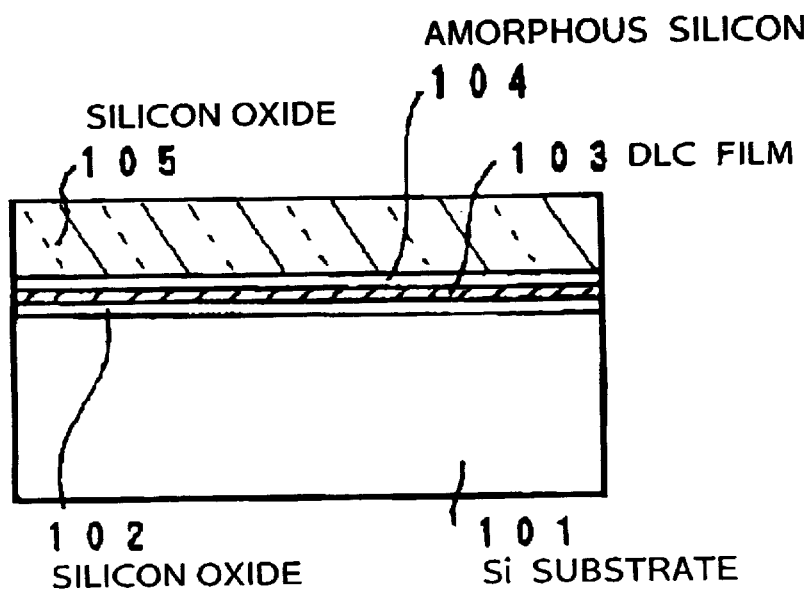
FIGS. 3A to 3J are diagrammatic sectional views of a semiconductor device, for illustrating a first embodiment of the process in accordance with the present invention for forming the shallow trench isolation structure.

As shown in FIG. 3A, a silicon oxide film 102 having a thickness of 10 nm is formed on a principal surface of a silicon substrate 101 by means of a thermal oxidation, and a diamond like carbon (abbreviated to "DLC") film 103 having a thickness of 10 nm is deposited on the silicon oxide film 102 by means of a plasma CVD process. Succeedingly, an amorphous silicon film 104 having a thickness of 100 nm is formed on the DLC film 103 as an ashing protecting film, by means of the plasma CVD process, and furthermore, a silicon oxide film 105 having a thickness of 100 nm is deposited on the amorphous silicon film 104 by means of the plasma CVD process. Here, the DLC film 103 is formed of an amorphous carbon, and therefore, has a high mechanical strength sufficient to function as a polishing stopper in the CMP process. However, the DLC film 103 can be etch-removed by an oxygen plasma at an etch rate which is higher than an etch rate of the silicon film such as a BPSG (borophosphosilicate glass) film and a BSG (boronsilicate glass) film.

Figure 3B:
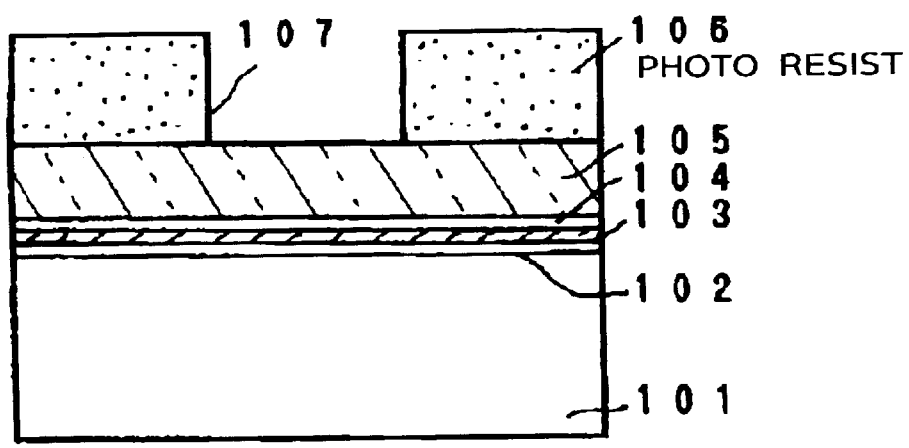
Figure 3C:
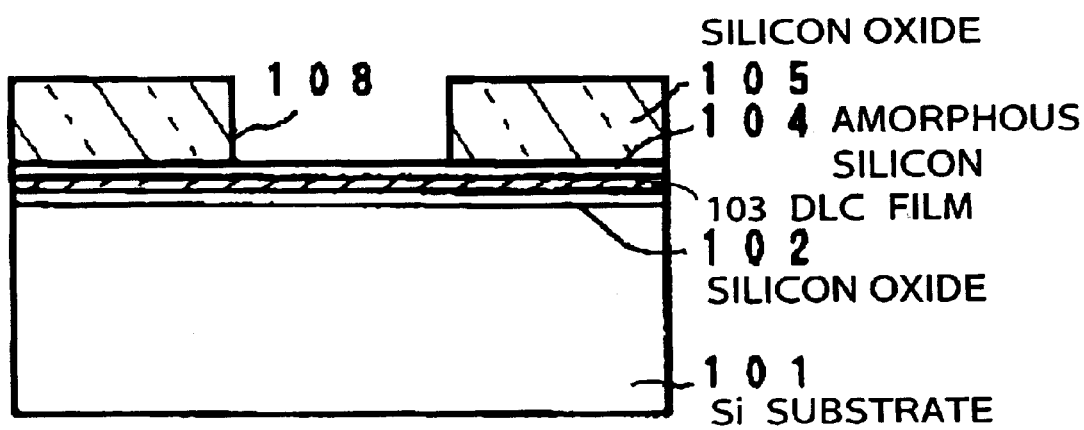

Thereafter, as shown in FIG. 3B, a photo resist film 106 is coated on the silicon oxide film 105, and exposed and developed by a photolithography using a not-shown photo mask, so as to form a patterned photo resist film 106 having an opening 107 along a device isolation region. By using the patterned photo resist film 106 as a mask, the silicon oxide film 105 is etched so that an opening 108 is formed in the silicon oxide film 105, as shown in FIG. 3C. Succeedingly, the patterned photo resist film 106 is removed by an oxygen ashing. In this ashing process, the asking protecting film 104 is exposed by removal of the silicon oxide film 105, but the asking protecting film 104 formed of the amorphous silicon is not removed by the oxygen ashing, and therefore, the underlying DLC film 103 is not removed by the oxygen ashing.

Figure 3D:
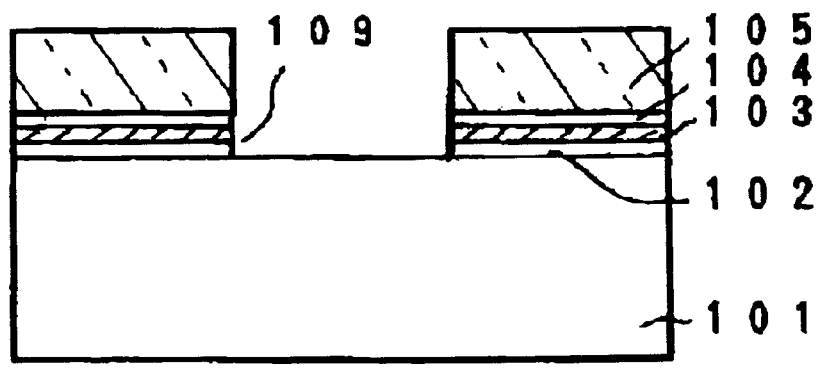

Thereafter, as shown in FIG. 3D, by using the patterned silicon oxide film 105 as a hard mask, the asking protecting film 104, the DLC film 103 and the silicon oxide film 102 are etched in the named order, so that an opening 109 is formed in a triple-layer film composed of the asking protecting film 104, the DLC film 103 and the silicon oxide film 102.

Thus, it becomes possible to selectively etch the DLC film 103 by using a photo resist, since the DLC film 103 is protected the asking protecting film 104, from the oxygen plasma for removing the photo resist, and since the asking protecting film 104 and the DLC film 103 can be selectively etched by using the hard mask formed of the patterned silicon oxide film 105.

Figure 3E:
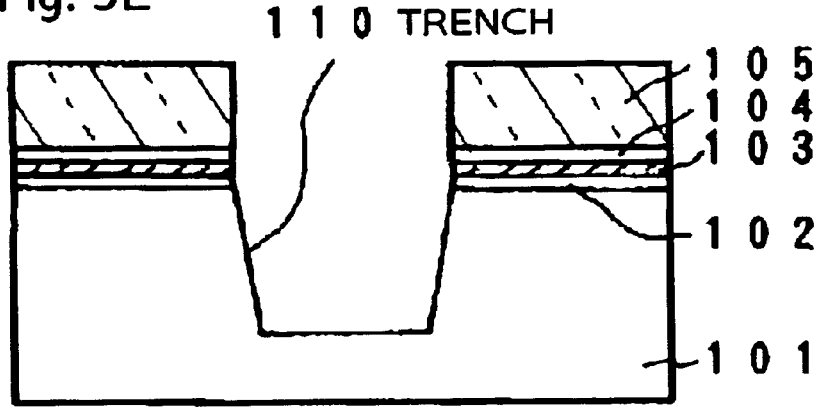

Thereafter, as shown in FIG. 3E, by using as a hard mask the patterned silicon oxide film 105 which protects the underlying asking protecting film 104 and DLC film 103, the silicon substrate 101 is selectively etched so that a trench 110 is formed. For example, this trench 110 has a depth of 0.3 $\mu$m and a width of 0.2 $\mu$m.

Figure 3F:
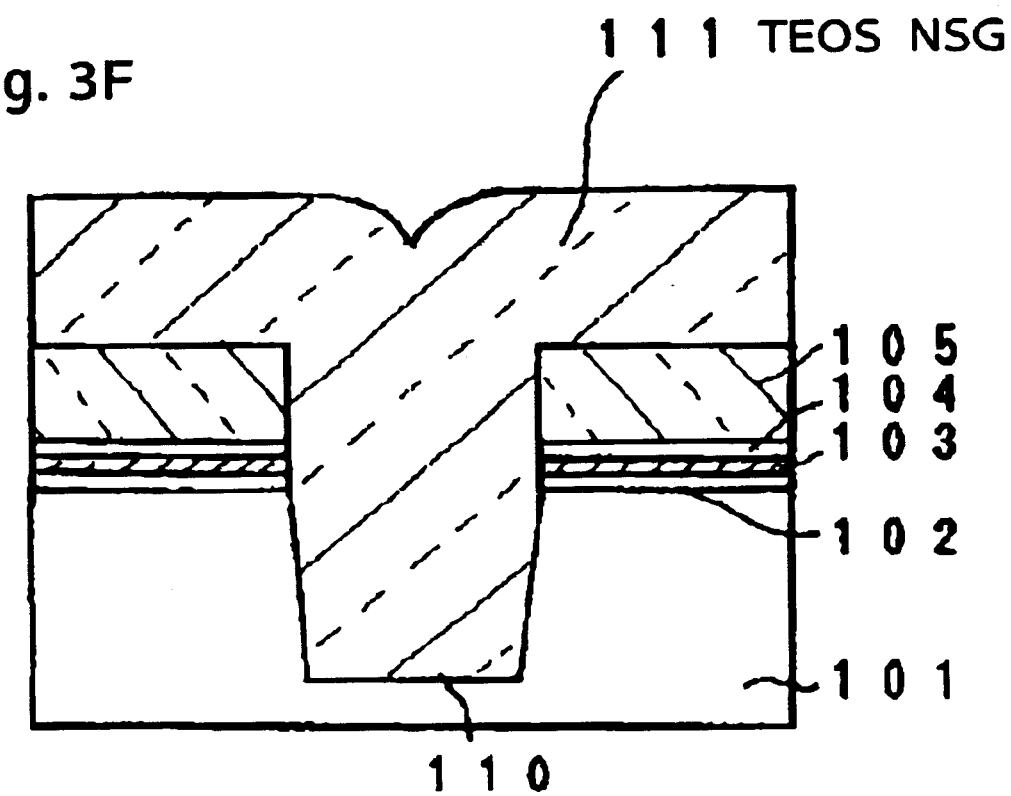
Figure 3G:
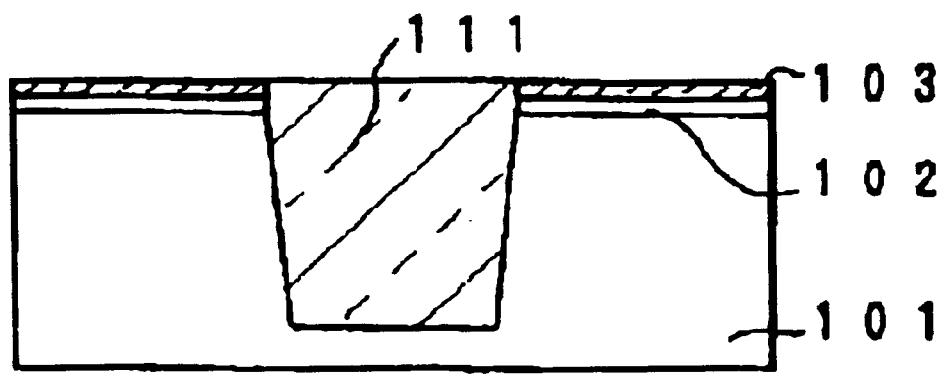

Furthermore, as shown in FIG. 3F, a TEOS NSG film 111 is deposited to have a thickness sufficiently larger than the depth of the trench 110, by decomposing TEOS (tetraethoxysilane) gas in a not-shown CVD machine chamber. Thus, the trench 110 is filled up by the deposited TEOS NSG film 111. Thereafter, a surface of the silicon substrate 101 is polished by the CMP process. In this CMP process, as shown in FIG. 3G, the TEOS NSG film 111 and the underlying silicon oxide film 105 are polished, and simultaneously, the further underlying asking protecting film 104 is polished. However, since the DLC film 103 under the asking protecting film 104 has a high etch-resistant property, the DLC film 103 functions as the etching stopper in the CMP process. Namely, the polishing is automatically stopped at the DLC film 103. Therefore, although the polishing amount varies on the surface of the wafer because the wafer has a camber or because the polishing rate is not even over the surface of the wafer, the wafer is polished to have a uniformly planarized surface in such a condition that the DLC film 103 is exposed at a whole surface of the wafer, namely, not only in a central region of the wafer but also in a peripheral region of the wafer.

Figure 3H:
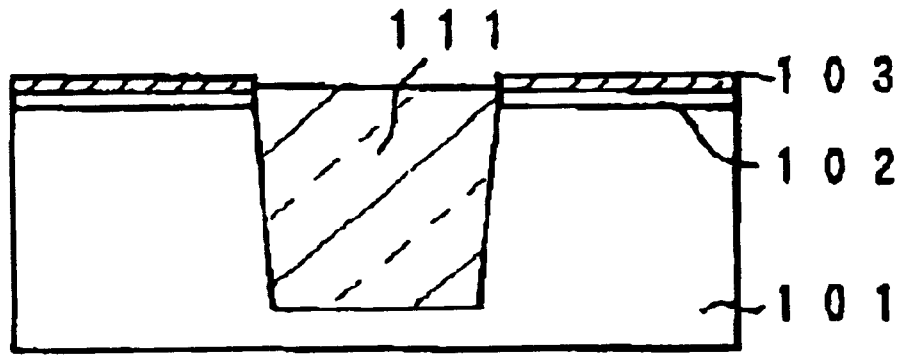
Figure 3I:
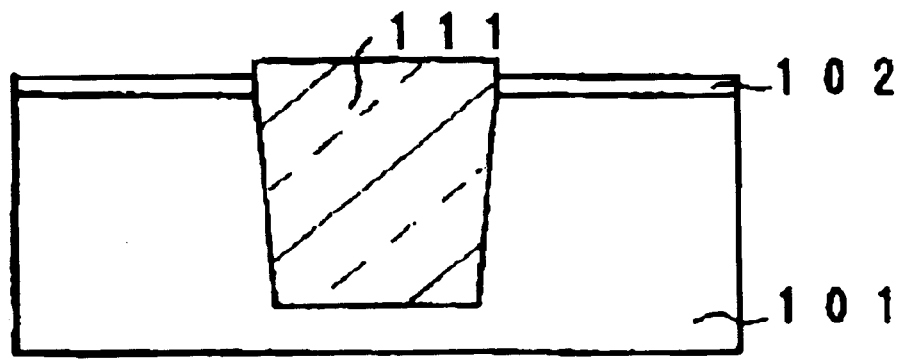
Figure 4A:
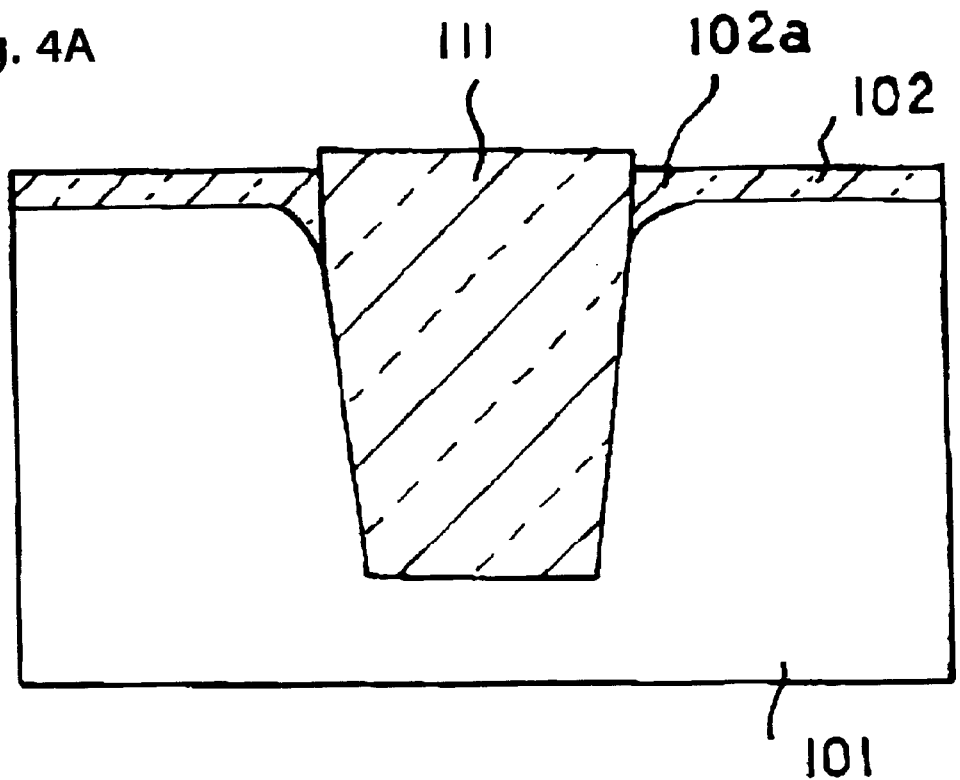
FIGS. 4A and 4B are enlarged sectional views of the semiconductor device, for illustrating a condition in the course of the process for forming the shallow trench isolation structure.

Then, as shown in FIG. 3H, a surface of the TEOS NSG film 111 is etched to a certain degree so that the level of the surface of the TEOS NSG film 111 is lower than the level of the DLC film 103. In this condition, furthermore, the DLC film 103 is removed by the oxygen plasma, as shown in FIG. 3I. Then, a heat treatment is carried out for an exposed silicon oxide film 102, so as to carry a so called rounding oxidation in which an edge of the silicon oxide film 102 in contact with the TEOS NSG film 111 is advanced in a depth direction by oxidation. In this rounding oxidation, as shown in the enlarged sectional view of FIG. 4A, oxidation is advanced in a tapered form from the edge 102a of the silicon oxide film 102, so that the height or depth of the TEOS NSG film 111 contacting with the silicon oxide film 102 becomes large at the edge of the silicon oxide film 102.

Figure 1A:
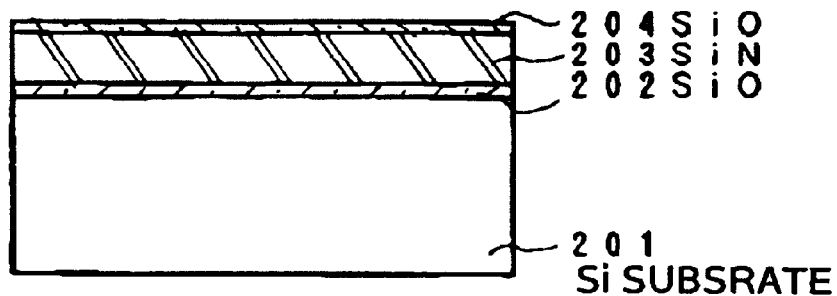
FIGS. 1A to 1H are diagrammatic sectional views of a semiconductor device, for illustrating a prior art process for forming the shallow trench isolation structure.
Figure 1B:
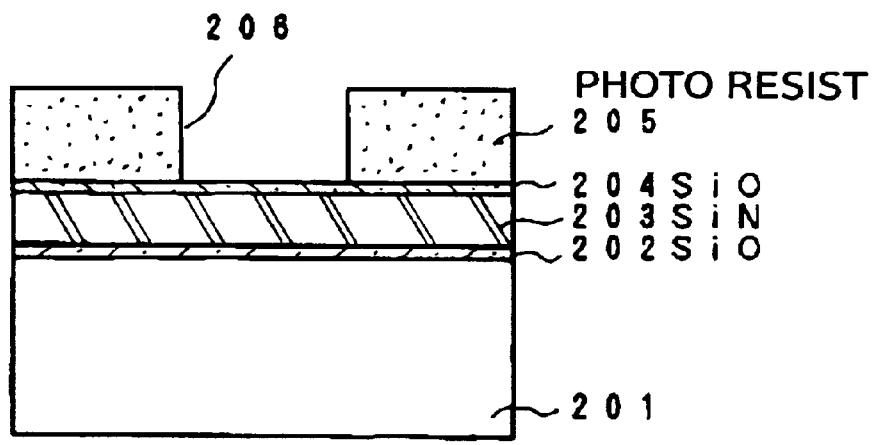
Figure 1C:
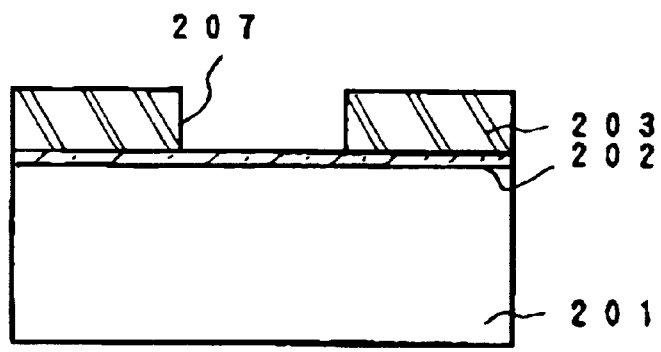
Figure 1D:
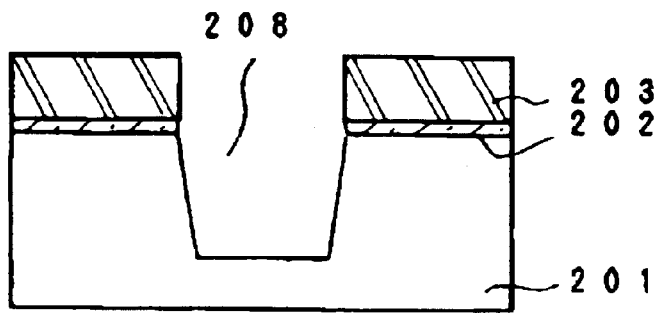
Figure 1E:
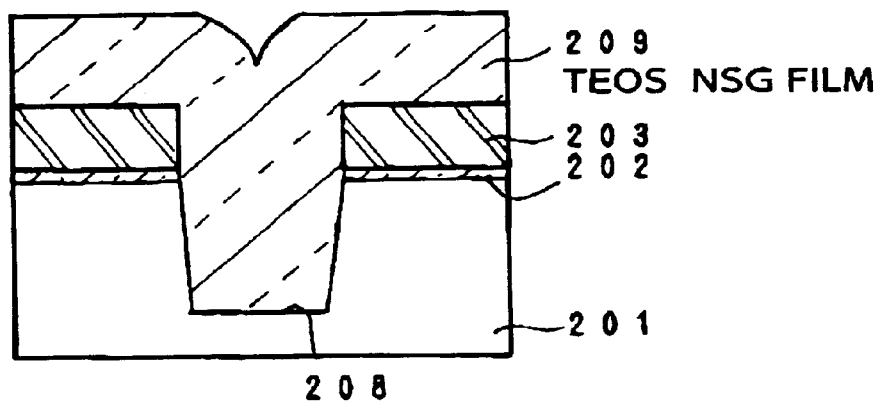
Figure 1F:
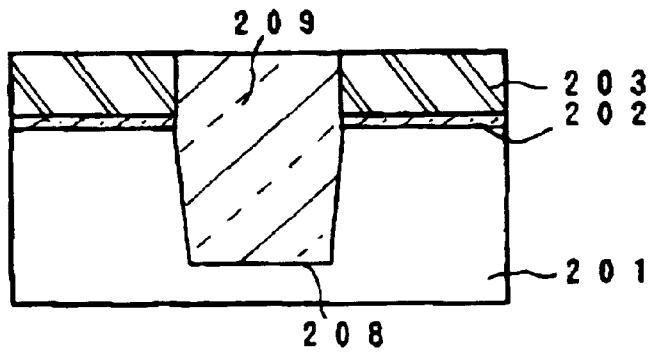
Figure 1G:
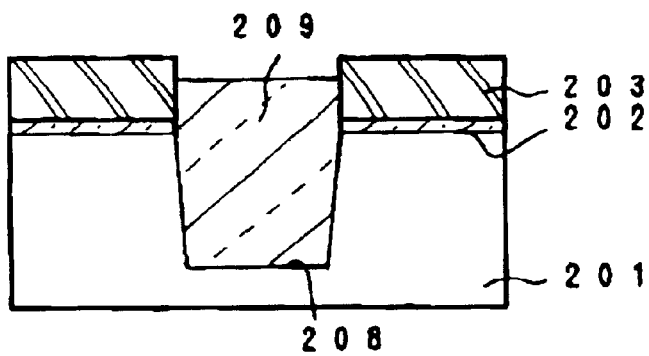
Figure 1H:
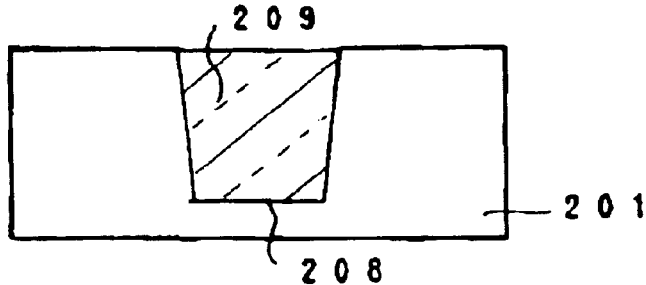
Figure 2A:
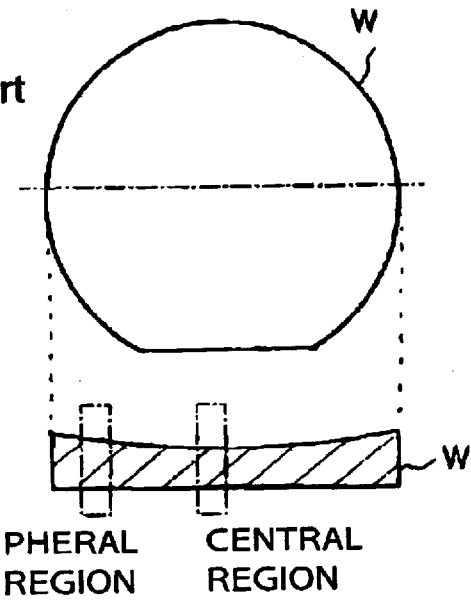
FIGS. 2A to 2E illustrate the various problems occurring in the or art process for forming the shallow trench isolation structure.
Figure 2B:
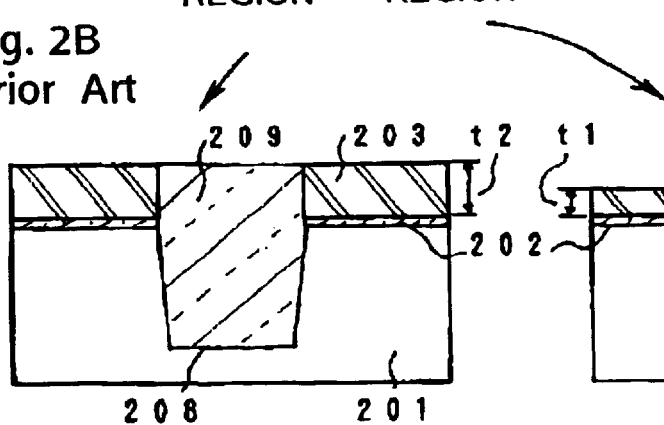
Figure 2C:
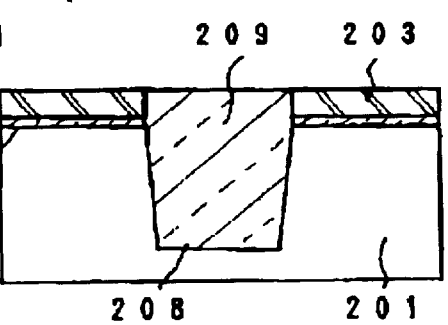
Figure 2D:
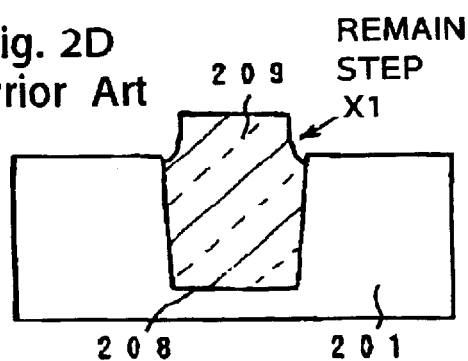
Figure 2E:
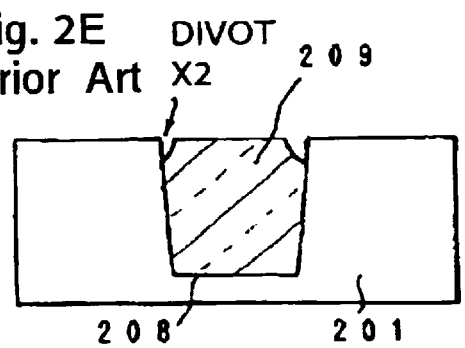
Figure 3J:
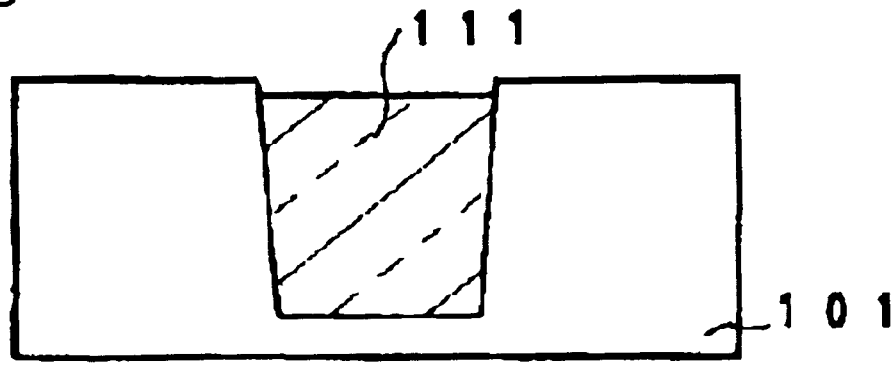
Figure 4B:
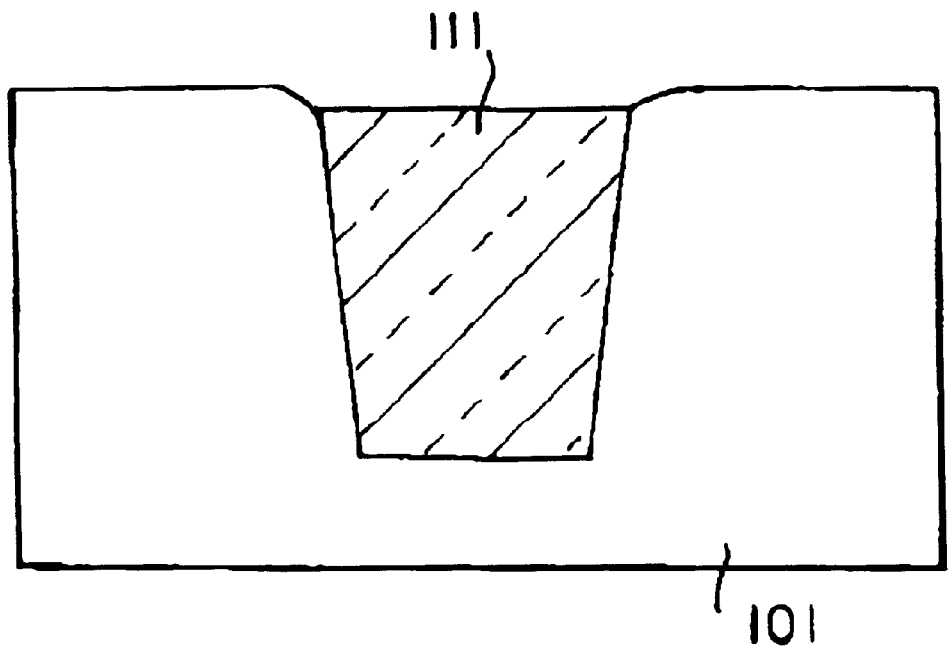

In this condition, as shown in FIG. 3J, the silicon oxide film 102 is isotropically wet-etched by a hydrofluoric acid. At this time, the surface of the TEOS NSG film 111 is simultaneously etched. Since the etching rate of the TEOS NSG film 111 is equal to the etching rate of the silicon oxide film 102, the TEOS NSG film 111 has an even surface height in the central region and in the peripheral region of the wafer. Namely, no remaining step occurs at the surface of the silicon substrate. Furthermore, since the edge of the silicon oxide film 102 in contact with the TEOS NSG film 111 is oxidized in the depth direction by the rounding oxidation, the TEOS NSG film 111 and the silicon oxide film 102 are uniformly etched as shown in the enlarged sectional view of FIG. 4B, with the result that the large divot as shown in FIG. 2E does not occur.

Thus, the trench isolation structure is formed.

Figure 5:
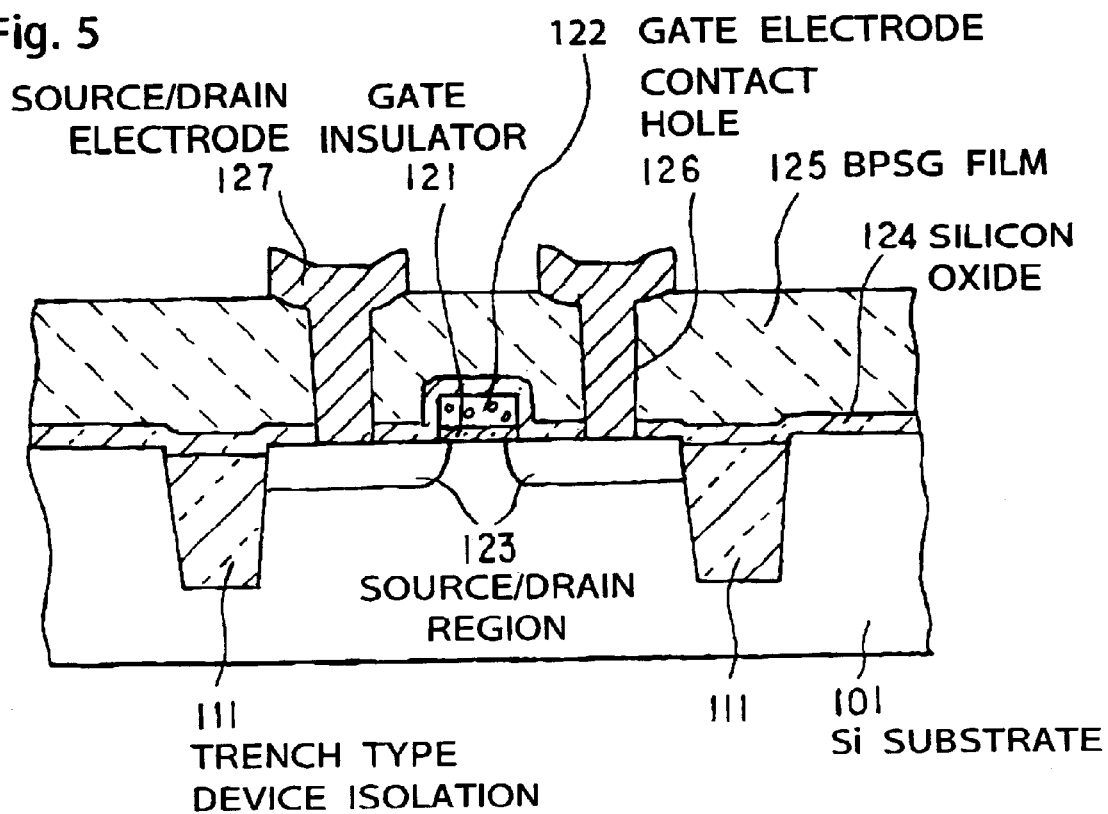
FIG. 5 is a diagrammatic sectional view of the semiconductor device fabricated in accordance with the first embodiment of the process in accordance with the present invention for forming the shallow trench isolation structure.

Thereafter, a silicon oxide film and a polysilicon film are formed on the surface of the silicon substrate 101 in the named order, and then, are selectively etched using a photolithography so that a gate insulator film 121 and a gate electrode 122, as shown in FIG. 5. By using the gate electrode 122, impurity is ion-implanted into a device formation region confined by the trench type device isolation formed of the TEOS NSG film 111 filled in the trench 110, so that a pair of source/drain regions 123 are formed. Then, a silicon oxide film 124 and a BPSG film 125 are formed on the whole surface to form a multi-layer interlayer insulator film. Contact holes 126 are formed through the multi-layer interlayer insulator film to reach the pair of source/drain regions 123, respectively, and source/drain electrodes 127 are formed to fill up the contact holes 126, respectively. Thus, one MOS transistor is completed.

As mentioned above, in the first embodiment, when the insulator film (TEOS NSG film) 111 filled in the trench 110 is polished by the CMP process, since the DLC film 103 formed on the surface of the silicon substrate 101 acts as the etching stopper, it is possible to make the surface of the insulator film (TEOS NSG film) 111 filled in the trench 110 coplanar with the surface of the silicon substrate, not only in a central region of the wafer but also in the peripheral region of the wafer. Therefore, it is possible to prevent generation of the remaining step in the trench isolation structure. Simultaneously, it is possible to prevent generation of the divot which was caused in the prior art because of an overetching of the insulator film (TEOS NSG film) 111 filled in the trench 110. Therefore, when the gate electrode 122 is formed on the device formation region in the silicon substrate 101 as shown in FIG. 4, the gate electrode can be formed to have a uniform size, and it is possible to prevent generation of the short-circuiting caused because of a size variation of the gate electrode and the etching residual of the gate electrode material.

Furthermore, in the process for patterning the DLC film 103 to form the opening 109, since the ashing protecting film 104 is formed to cover and protect the DLC film 103, and since the hard mask 105 of the silicon oxide film is formed on the ashing protecting film 104, after the DLC film 103 is patterned by using the photo resist film 106, even if the photo resist film 106 is removed by the ashing, the DLC film is not removed by the ashing process. Therefore, it is possible to pattern the DLC film with a high degree of precision, and accordingly, it is possible to realize the above mentioned trench isolation structure. In addition, it is possible to form the trench 100 in the silicon substrate 101 while protecting the ashing protecting film 104 and the DLC film 103 by means of the hard mask 105 of the silicon oxide film.

Now, a second embodiment of the process in accordance with the present invention for forming the buried interconnection structure will be described with reference to FIGS. 7A to 7H which are diagrammatic sectional views of a semiconductor device, for illustrating the second embodiment of the process in accordance with the present invention.

Figure 6:
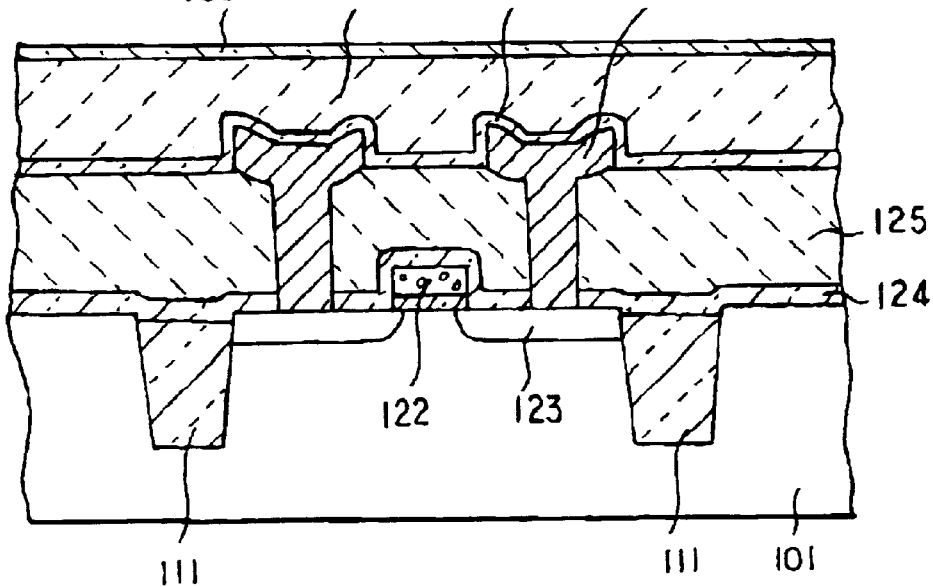
FIG. 6 is a diagrammatic sectional view of the semiconductor device, to which the process in accordance with the present invention for forming the buried interconnection structure can be applied.

After the MOS transistor is formed in the silicon substrate as shown in FIG. 5, a silicon oxide film 131 is formed to cover the whole surface of the silicon substrate by means of the plasma CVD process, as shown in FIG. 6, and furthermore, an interlayer insulator film 132 formed of BPSG or BSG is deposited on the silicon oxide film 131. In addition, a silicon oxide film 133 is formed to cover the interlayer insulator film 132 by means of the plasma CVD process, also shown in FIG. 6.

In FIGS. 7A to 7H, the structure under a triple-layer interlayer insulator film structure composed of the films 131, 132 and, 133 are omitted for simplification of the drawings, and only a structure formed on the triple-layer interlayer insulator film structure will be shown.

Figure 7A:
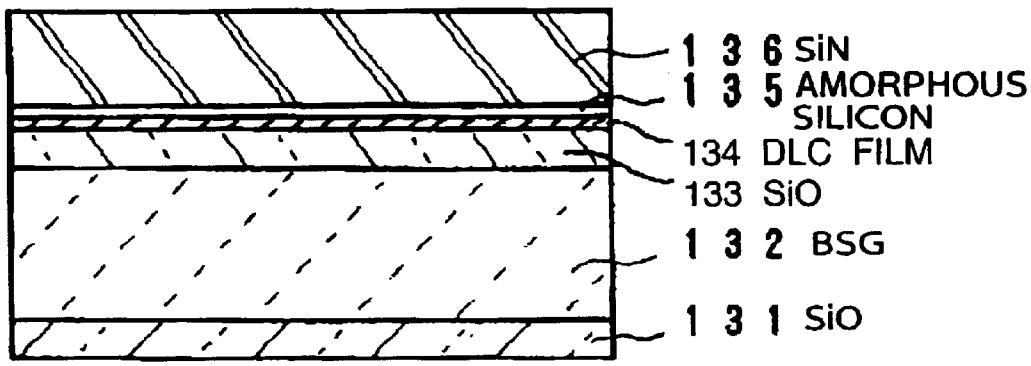
FIGS. 7A to 7H are diagrammatic sectional views of a semiconductor device, for illustrating the second embodiment of the process in accordance with the present invention for forming the buried interconnection structure.

After the structure shown in FIG. 6 is obtained, a DLC film 134 having a thickness of 10 nm is formed by the plasma CVD process as shown in FIG. 7A, and then, an amorphous silicon film 135 having a thickness of 100 nm is formed on the DLC film 134 as an ashing protecting film, by means of the plasma CVD process. Furthermore, a silicon nitride film 136 having a thickness of 100 nm is deposited on the amorphous silicon film 135 by means of the plasma CVD process. Here, the amorphous silicon film 135 of the ashing protecting film can be replaced with a silicon nitride film. In this modification, on the silicon nitride film, an amorphous silicon film is formed. Therefore, the modification can be realized by exchanging the he silicon nitride film and the amorphous silicon film in the following steps which will be explained below.

Figure 7B:
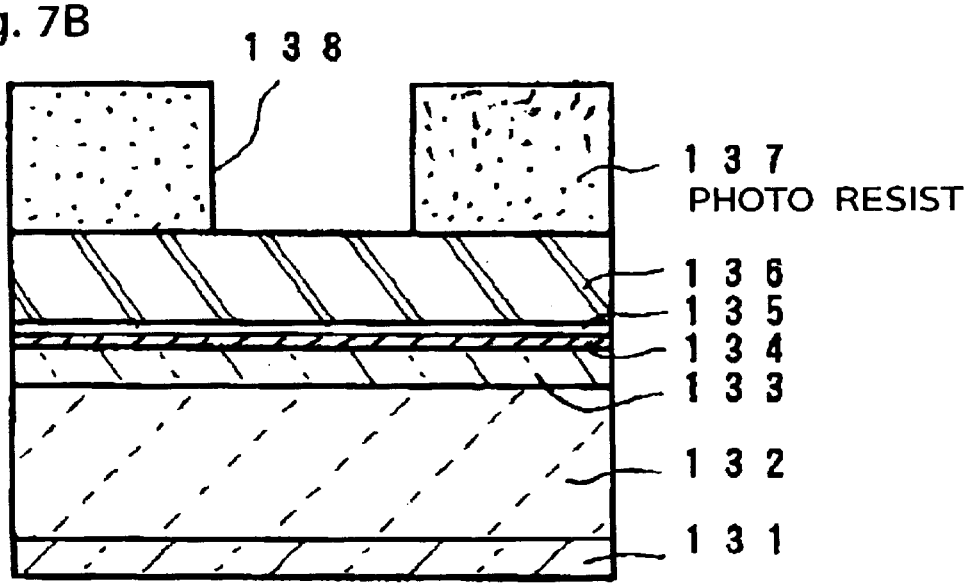
Figure 7C:
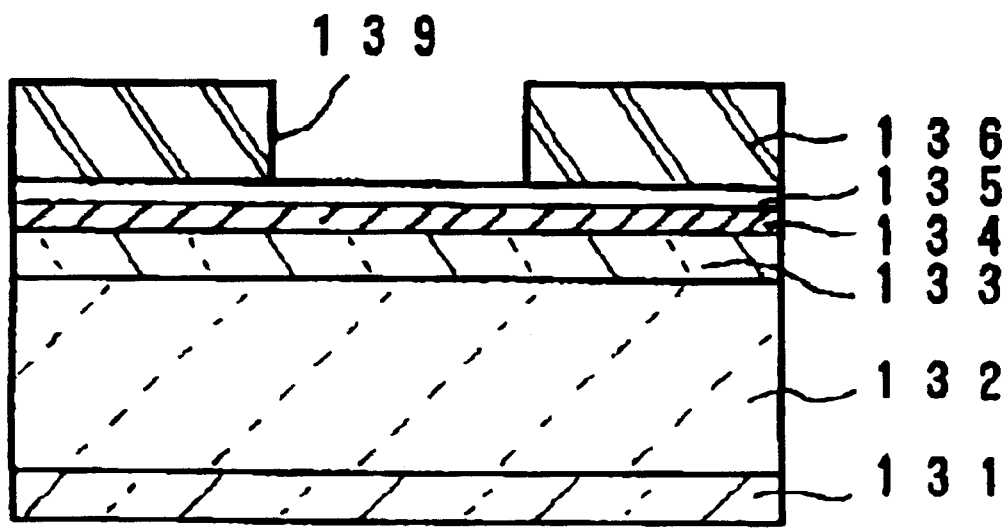

Thereafter, as shown in FIG. 7B, a photo resist film 137 is coated on the silicon nitride film 136, and exposed and developed by a photolithography using a not-shown photo mask, so as to form a patterned photo resist film 137 having an opening 138 along an interconnection forming region. By using the patterned photo resist film 137 as a mask, the silicon nitride film 136 is etched so that an opening 139 is formed in the silicon nitride film 136, as shown in FIG. 7C. Succeedingly, the patterned photo resist film 137 is removed by an oxygen ashing. In this ashing process, the asking protecting film 135 is exposed by removal of the silicon nitride film 136, but the asking protecting film 135 formed of the amorphous silicon is not removed by the oxygen ashing, and therefore, the underlying DLC film 134 is not removed by the oxygen ashing.

Figure 7D:
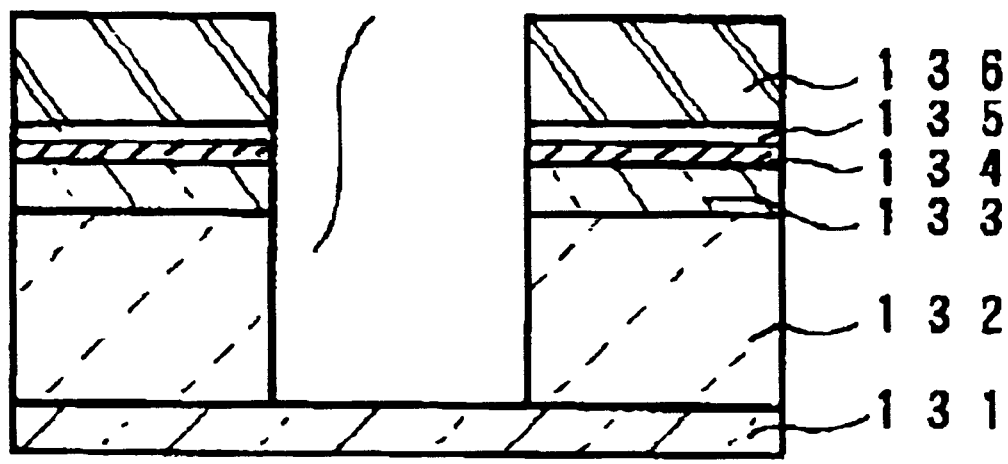

Thereafter, as shown in FIG. 7D, by using the patterned silicon nitride film 136 as a hard mask, the asking protecting film 135, the DLC film 134, the silicon oxide film 133 and the interlayer insulator film 132 are etched in the named order, so that a trench. 140 is formed.

Thus, it becomes possible to selectively etch the DLC film 134 by using a photo resist, since the DLC film 134 is protected the asking protecting film 135, from the oxygen plasma for removing the photo resist, and since the asking protecting film 135 and the DLC film 134 can be selectively etched by using the hard mask formed of the patterned silicon nitride film 136.

Figure 7E:
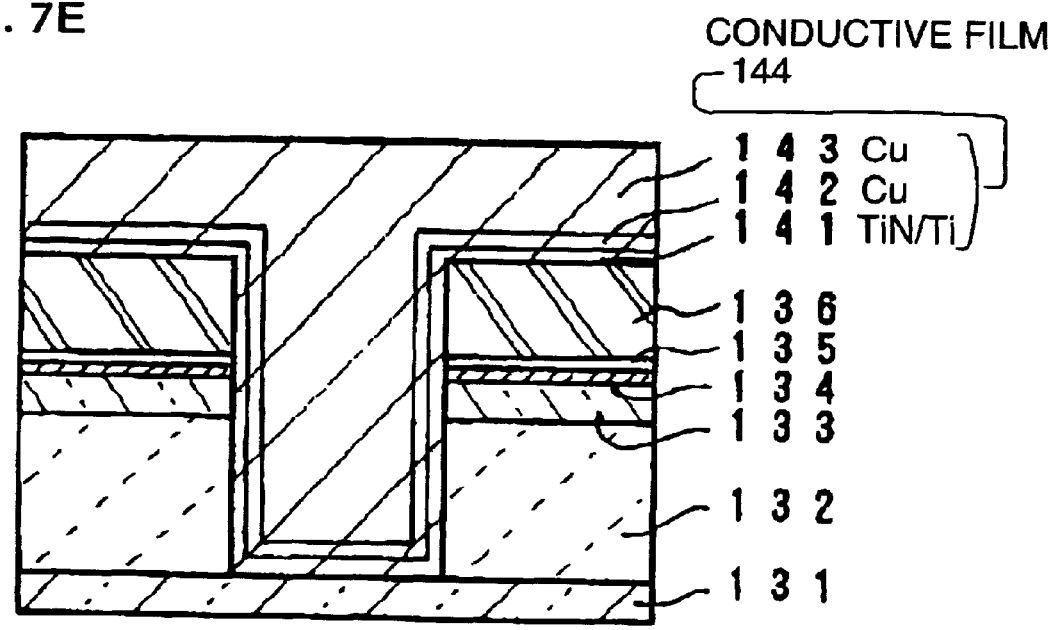

Thereafter, as shown in FIG. 7E, by using a not-shown sputtering machine, a TiN/Ti film 141 is sputtered as a barrier metal to cover the whole surface, and a Cu film 142 is sputtered to cover the TiN/Ti film 141, and furthermore, a Cu plated film 143 is formed on the sputtered Cu film 142, so that a conductive film 144 having a thickness sufficient to completely fill up the trench 140 is formed.

Figure 7F:
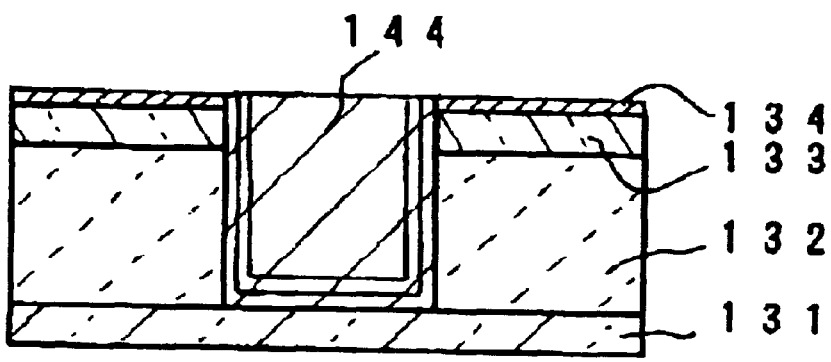

Then, a surface of the conductive film 144 is polished by the CMP process. In this CMP process, as shown in FIG. 7F, the conductive film 144 and the underlying silicon nitride film 136 are polished, and simultaneously, the further underlying asking protecting film 135 is polished. However, since the DLC film 134 under the asking protecting film 135 has a high etch-resistant property, the DLC film 134 functions as the etching stopper in the CMP process. Namely, the polishing is automatically stopped at the DLC film 134. Therefore, although the polishing amount varies on the surface of the wafer because the wafer has a camber or because the polishing rate is not even over the surface of the wafer, the wafer is polished to have a uniformly planarized surface in such a condition that the DLC film 134 is exposed at a whole surface of the wafer, namely, not only in a central region of the wafer but also in a peripheral region of the wafer.

Figure 7G:
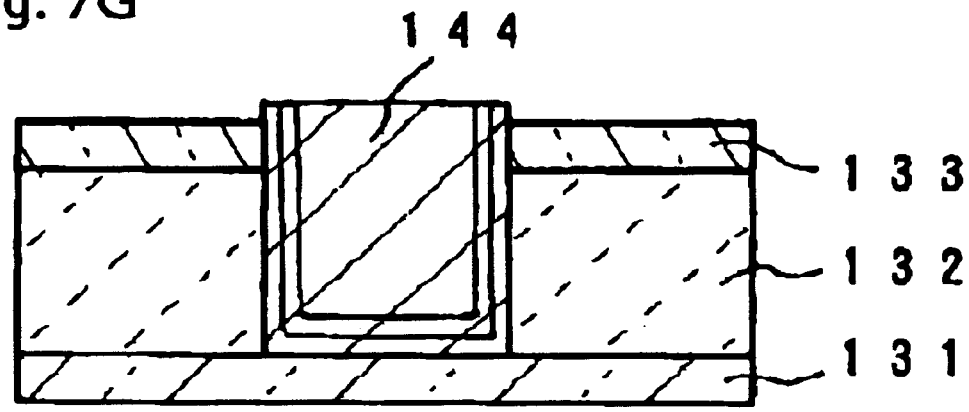

Then, as shown in FIG. 7G, the DLC film 134 is removed by the oxygen plasma. In this condition, a top surface of the conductive film 144 filled in the trench 140 projects from the surface of the silicon oxide film 133 to some degree.

Figure 7H:
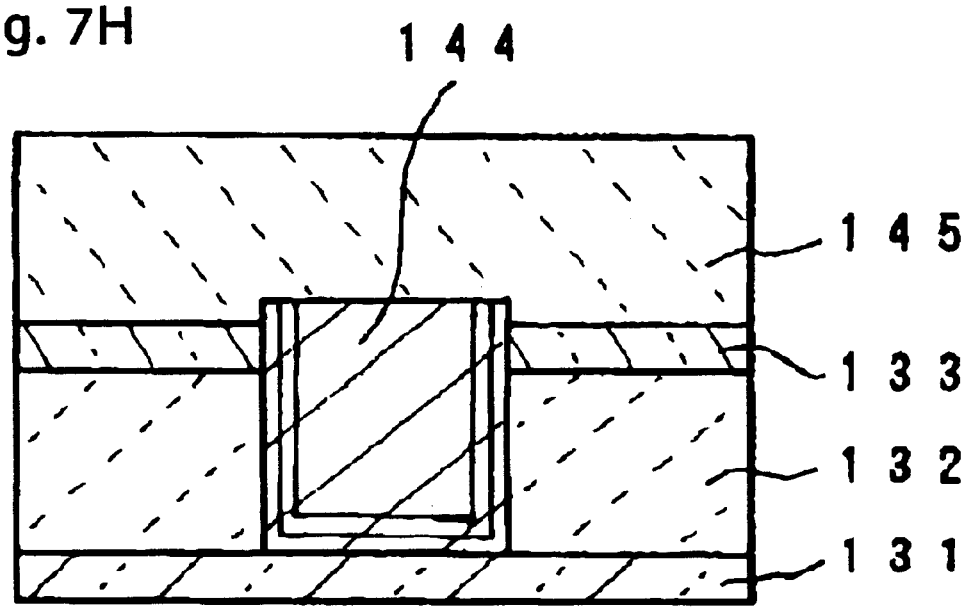
Figure 8:
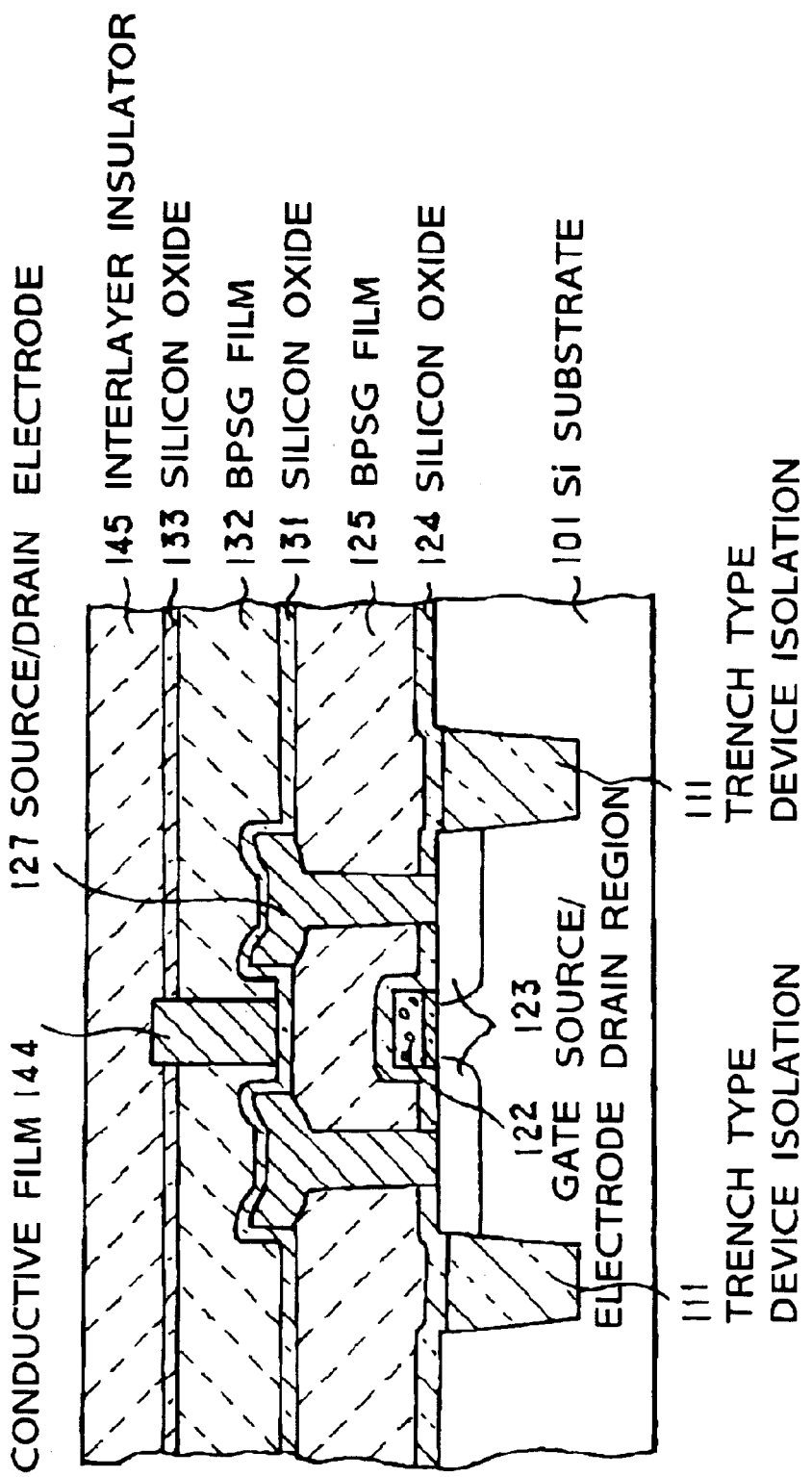
FIG. 8 is a diagrammatic sectional view of the semiconductor device fabricated in accordance with a second embodiment of the process in accordance with the present invention for forming the buried interconnection structure.

Thereafter, as shown in FIG. 7H and FIG. 8, an interlayer insulator film 145 formed of BPSG or BSG is deposited on the whole surface including the conductive film 144. A semiconductor device having the MOS transistor and an interconnection (conductive film 144) buried in the lower level interlayer insulator film (BPSG film 132). Incidentally, since the amount of the conductive film 144 projecting from the surface of the silicon oxide film 133 is on the order of the thickness of the DLC film 134 (10 nm), this does not influence at all on the planarity of the upper level interlayer insulator film 145.

As mentioned above, in the second embodiment, when the conductive film (TiN/Ti/Cu) 144 filled in the trench 140 formed in the lower level interlayer insulator film 132 is polished by the CMP process, since the DLC film 134 formed on the surface of the silicon oxide film 133 formed on the lower level interlayer insulator film 132 acts as the etching stopper in the CMP process, it is possible to uniformalize the thickness of the conductive film 144 over the whole surface of the wafer so that the thickness of the conductive film 144 is uniform not only in a central region of the wafer but also in the peripheral region of the wafer.

Therefore, the step difference between the top surface of the conductive film 144 and the surface of the silicon oxide film 133 formed on the interlayer insulator film can be made uniform over the whole region of the wafer. In other words, the top surface of the conductive film 144 never extremely projects from the surface of the interlayer insulator film, nor does it extremely recess from the surface of the interlayer insulator film, with the result that the planarity is never deteriorated.

In addition, similarly to the first embodiment, in the process for patterning the DLC film 134 to form the opening, since the ashing protecting film 135 is formed to cover and protect the DLC film 134, and since the hard mask 136 of the silicon nitride film is formed on the ashing protecting film 135, after the DLC film 134 is patterned by using the photo resist film 137, even if the photo resist film 137 is removed by the ashing, the DLC film is not removed by the ashing process. Therefore, it is possible to pattern the DLC film with a high degree of precision, and accordingly, it is possible to realize the buried interconnection structure having a high degree of precision.

In the above mentioned embodiments, the DLC film is formed of a diamond like carbon film, but can be formed of a diamond film. Therefore, in the appending claims and the summary of invention, the term "DLC film" should be construed to include not only a diamond like carbon film but also a diamond film. In addition, the ashing protecting film and the hard mask are in no way limited to those shown in the above mentioned embodiments, but can be formed of any material having an equivalent function. Furthermore, the present invention is applied to the trench isolation structure and the buried interconnection structure, but can be similarly applied to any buried structure in which an insulator film or a conductive film is filled up in a trench formed in a substrate and a surface is required to be planarized.

As seen from the above, according to the present invention, when the insulator film or the conductive film filled up in a trench formed in the substrate or the interlayer insulator film is etched back by the CMP process, since the DLC film is formed as the etching stopper in the CMP process, the insulator film or the conductive film can be polished to have a uniform thickness over the whole region of the wafer so that the thickness of the insulator film or the conductive film in the peripheral region of the wafer is substantially equal to the thickness of the insulator film or the conductive film in the central region of the wafer. Therefore, it is possible to prevent the generation of the step in the trench isolation structure and the buried interconnection structure, and also to prevent generation of the divot.

In addition, in the process for previously patterning the DLC film to form the trench, since the ashing protecting film is previously formed to cover and protect the DLC film, and since the hard mask of the silicon nitride or oxide film is formed on the ashing protecting film, after the DLC film is patterned by using the photo resist film, even if the photo resist film is removed by the ashing, the DLC film is not removed by the ashing process. Therefore, it is possible to pattern the DLC film with a high degree of precision, and accordingly, it is possible to realize the trench isolation structure and the buried interconnection structure with a high degree of precision.

The invention has thus been shown and described with reference to the specific embodiments. However, it should be noted that the present invention is in no way limited to the details of the illustrated structures but changes and modifications may be made within the scope of the appended claims.

The content of Japanese Patent Application No. Heisei 10-377124 filed on Dec. 30, 1998 including the specification, claims and drawings, is incorporated by reference in its entirety into this application.

What is claimed is:

1. A process for fabricating a semiconductor device, comprising the steps:

forming an DLC film on a surface of a basic layer;

forming on said DLC film an ashing protecting film for protecting said DLC film from an ashing;

forming on said ashing protecting film a hard mask film having a resisting property against an etching agent for said ashing protecting film and said DLC film;

patterning said hard mask film using a patterned photo resist film as a mask;

removing said patterned photo resist film by the ashing;

patterning said ashing protecting film and said DLC film using the patterned hard mask film as a mask, and forming a trench in said surface of said basic layer;

depositing a film on the whole surface to fill up said trench;

removing said deposited film, said hard mask film and said ashing protecting film by a chemical mechanical polishing, using said DLC film as an etching stopper; and removing said DLC film by the ashing, so that said deposited film remains in only said trench.

2. A process claimed in claim 1 wherein said basic layer is formed of a semiconductor substrate, and said trench is formed in a principal surface of said semiconductor substrate, and said deposited film is an insulator film filled up in said trench formed in said principal surface of said semiconductor substrate, so that a trench isolation structure is formed.

3. A process claimed in claim 1 wherein said basic layer is formed of an interlayer insulator film formed on a semiconductor substrate, and said trench is formed in said interlayer insulator film, and said deposited film is a conductive film filled up in said trench formed in said interlayer insulator film, so that a buried interconnection structure is formed.

4. A process for fabricating a semiconductor device, comprising the steps:

forming on a surface of a silicon substrate a first silicon oxide film, an DLC film, an amorphous silicon film constituting an ashing protecting film, and a second silicon oxide film acting as a hard mask film, in the named order;

patterning said second silicon oxide film using a patterned photo resist film as a mask;

removing said patterned photo resist film by an ashing;

selectively etching said amorphous silicon film, said DLC film and said first silicon oxide film using the patterned second silicon oxide film as a mask;

forming a trench in said surface of said silicon substrate using said amorphous silicon film, said DLC film and said first silicon oxide film as a mask;

depositing on the whole surface including said trench an insulator film having a thickness sufficient to completely fill up said trench with the deposited insulator film;

removing said deposited insulator film, said second silicon oxide film and said amorphous silicon film by a chemical mechanical polishing, using said DLC film as an etching stopper;

removing said DLC film by the ashing; and removing said first silicon oxide film, so that said deposited insulator film remains in only said trench.

5. A process claimed in claim 4 wherein after said DLC film is removed by the ashing but before said first silicon oxide film is removed, a rounding oxidation is carried out so that an edge of said first silicon oxide film in contact with said deposited insulator film filled up in said trench is advanced in a depth direction by oxidation, and a top surface of said deposited insulator film filled up in said trench is etched to a level of said surface of said silicon substrate.

6. A process for fabricating a semiconductor device, comprising the steps:

forming an DLC film, an ashing protecting film, and a hard mask film in the named order, on a surface of a lower level interlayer insulator film formed on a silicon substrate in which a circuit device is formed;

patterning said hard mask film using a patterned photo resist film as a mask;

removing said patterned photo resist film by an ashing;

selectively etching said ashing protecting film and said DLC film using the patterned hard mask film as a mask;

forming a trench in said surface of said lower level interlayer insulator film using said hard mask film, said ashing protecting film and said DLC film as a mask depositing on the whole surface including said trench a conductive film having a thickness sufficient to completely fill up said trench with the deposited conductive film;

removing said deposited conductive film, said hard mask film and said ashing protecting film by a chemical mechanical polishing, using said DLC film as an etching stopper;

removing said DLC film by the ashing; and forming an upper level interlayer insulator film to cover at least said deposited conductive film remaining in said trench.

7. A process claimed in claim 6 wherein one of said ashing protecting film and said hard mask film is formed of an amorphous silicon film, and the other of said ashing protecting film and said hard mask film is formed of a silicon nitride film.

* * * * *